United States Patent
Sutardja et al.

(10) Patent No.: US 8,026,742 B1
(45) Date of Patent: *Sep. 27, 2011

(54) PHASE DETECTOR

(75) Inventors: Pantas Sutardja, Los Gatos, CA (US); Christopher L. Painter, Longmont, CO (US); Yingxuan Li, Cupertino, CA (US); Qing Yang, San Jose, CA (US)

(73) Assignee: Marvell International Ltd. (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/860,440

(22) Filed: Aug. 20, 2010

Related U.S. Application Data

(63) Continuation of application No. 11/518,115, filed on Sep. 8, 2006, now Pat. No. 7,791,378.

(60) Provisional application No. 60/757,583, filed on Jan. 10, 2006.

(51) Int. Cl.
*H03D 13/00* (2006.01)

(52) U.S. Cl. .......................... 327/12; 327/156

(58) Field of Classification Search ............ 327/2–12
See application file for complete search history.

(56) References Cited

U.S. PATENT DOCUMENTS

| | | | |
|---|---|---|---|
| 5,103,191 A * | 4/1992 | Werker | 331/1 A |
| 5,539,345 A | 7/1996 | Hawkins | |
| 5,923,715 A * | 7/1999 | Ono | 375/376 |
| 5,936,430 A * | 8/1999 | Patterson | 327/12 |
| 6,483,389 B1 | 11/2002 | Lamb | |
| 2003/0155947 A1 | 8/2003 | Fredriksson | |
| 2004/0232947 A1 | 11/2004 | Temporiti Milani et al. | |

OTHER PUBLICATIONS

Braat, Joseph, "Deferential time detection for radial tracking of optical disks", *Applied Optics*, vol. 37 No. 29, Oct. 10, 1998, pp. 6973-6982.
Razavi, Behzad, "Design of Analog CMOS Integrated Circuits", 2000, p. 553.
ECMA Standardizing Information and Communication Systems, Standard ECMA—267, 3rd edition—Apr. 2001, Annex C, pp. 43-46.
Braat et al., "Diffractive Read-out of Optical Discs", 2003, pp. 1-43.

* cited by examiner

*Primary Examiner* — Lincoln Donovan
*Assistant Examiner* — Ryan C Jager

(57) ABSTRACT

In one embodiment, a phase detector is provided comprising a first input, a second input, and first circuitry in communication with the first and second inputs, the first circuitry operative to provide an indication of a phase difference between a first signal supplied by the first input and a second signal supplied by the second input, wherein an aberration in one of the first and second signals results in an incorrect indication of phase difference. The phase detector also comprises second circuitry in communication with the first circuitry, the second circuitry operative to provide a correct indication of phase difference despite the aberration in the at least one of the first and second signals. In another embodiment, a differential phase detector is provided.

20 Claims, 11 Drawing Sheets

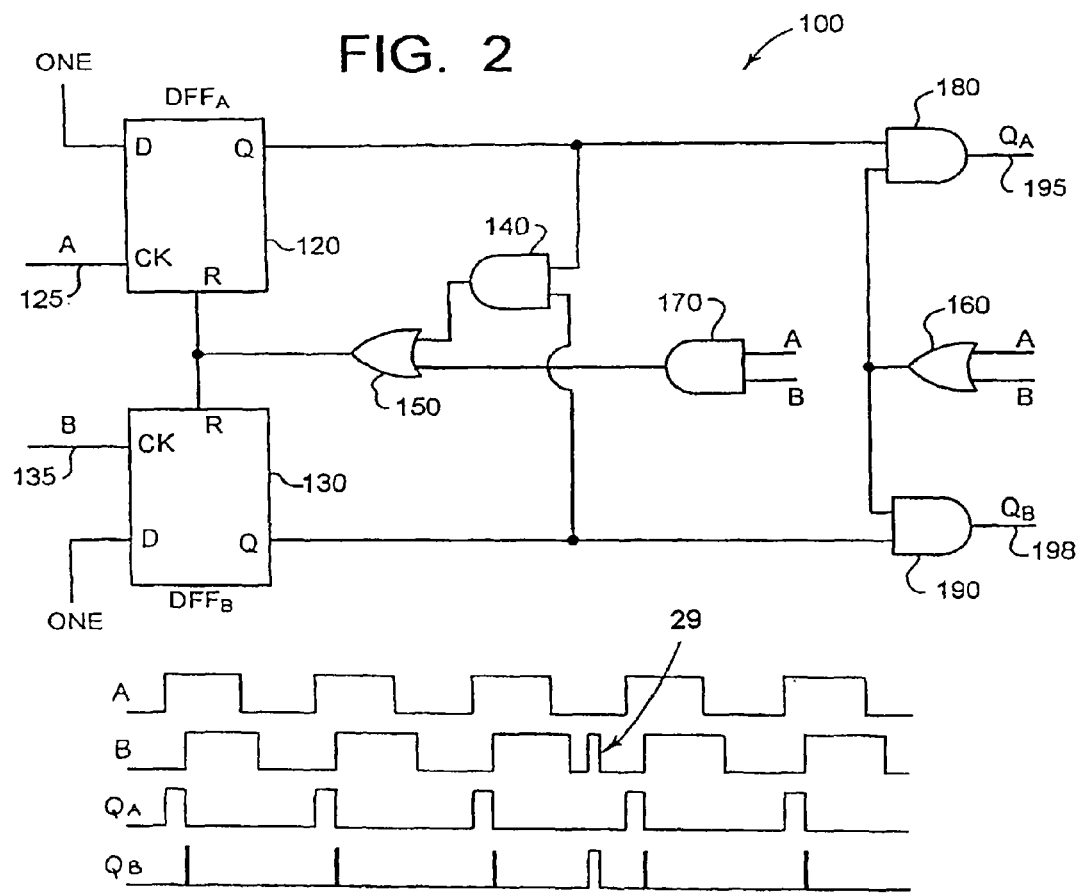
FIG. 2
FIG. 3
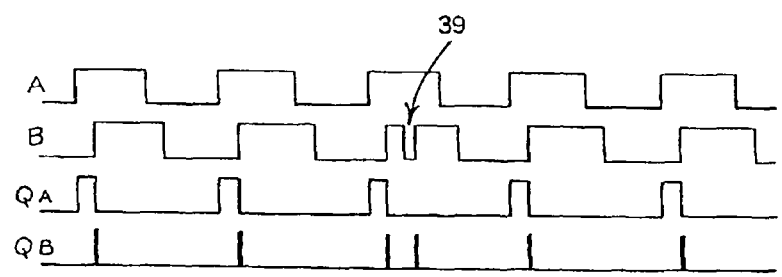
FIG. 4

US 8,026,742 B1

PHASE DETECTOR

CROSS-REFERENCES TO RELATED APPLICATIONS

This application is a continuation application of commonly-assigned U.S. patent application Ser. No. 11/518,115, filed Sep. 8, 2006 now U.S. Pat. No. 7,791,378, which claims the benefit under 35 USC 119(e) of U.S. Provisional Application No. 60/757,583, filed Jan. 10, 2006, the contents of both of which are incorporated herein by reference in their entirety.

BACKGROUND

A phase/frequency detector (PFD) can detect both phase and frequency difference and is commonly used in combination with a voltage-controlled oscillator in phase-lock loop designs. Phase/frequency detectors are also used in differential phase detectors. When a phase/frequency detector is used to compare two signals that have the same frequency, the output of the phase/frequency detector produces a pulse width equal to the phase difference between the signals. However, in such a situation, an aberration in one of the signals (e.g., a noise glitch) can generate an error in phase comparison, indicating that the signal has a leading phase relationship instead of a lagging phase relationship, or vice versa.

SUMMARY

The present invention is defined by the following claims, and nothing in this section should be taken as a limitation on those claims.

By way of introduction, the embodiments relate to a phase detector. In one embodiment, a phase detector is provided comprising a first input, a second input, and first circuitry in communication with the first and second inputs, the first circuitry operative to provide an indication of a phase difference between a first signal supplied by the first input and a second signal supplied by the second input, wherein an aberration in one of the first and second signals results in an incorrect indication of phase difference. The phase detector also comprises second circuitry in communication with the first circuitry, the second circuitry operative to provide a correct indication of phase difference despite the aberration in at least one of the first and second signals. In another embodiment, a differential phase detector is provided. Other embodiments are provided, and each of the embodiments described herein can be used alone or in combination with one another.

The embodiments will now be described with reference to the attached drawings.

BRIEF DESCRIPTION OF THE DRAWINGS

FIG. 2 is a functional block diagram of a phase detector of an embodiment.

FIG. 3 is a timing diagram of the phase detector of FIG. 2 when $f_A = f_B$ and an aberration causes an erroneous high signal in one of the input signals.

FIG. 4 is a timing diagram of the phase detector of FIG. 2 when $f_A = f_B$ and an aberration causes an erroneous low signal in one of the input signals.

DETAILED DESCRIPTION OF THE EMBODIMENTS

Figure 1A:
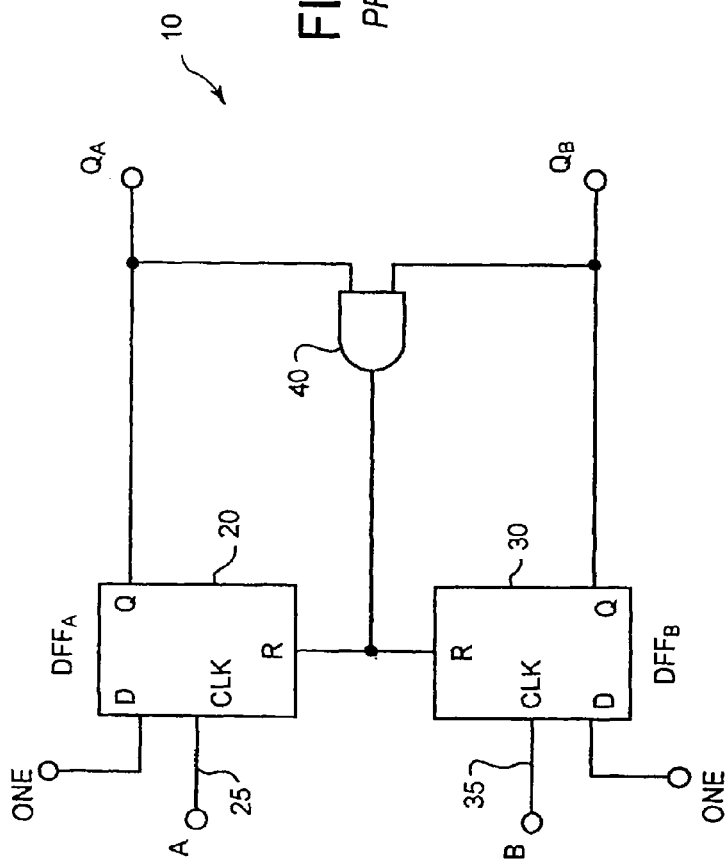
FIG. 1A is a functional block diagram of a prior art phase/frequency detector.

FIG. 1A is a functional block diagram of a prior art phase/frequency detector 10. The phase/frequency detector 10 comprises first and second D (i.e., delay) flip-flops ($DFF_A$ 20 and $DFF_B$ 30), each having a D input, a clock input, a reset input, and a Q output. The D inputs of the first and second flip-flops 20, 30 are provided with a 1 (or high) signal, and the two signals to be compared (signals A and B) are provided to the clock inputs of the first and second flip-flops 20, 30 from first and second inputs 25, 35. The phase/frequency detector 10 also comprises an AND gate 40, whose inputs are connected to the Q outputs of the first and second flip-flops 20, 30. The output of the AND gate 40 is provided to the reset inputs of the first and second flip-flops 20, 30.

Figure 1B:
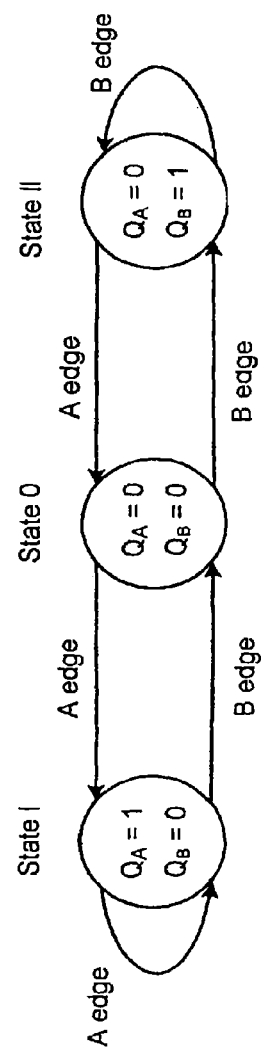
FIG. 1B is a state diagram of the phase/frequency detector of FIG. 1A.

In operation, the D input (the high signal) enters the flip-flops 20, 30 upon the positive edge of the clock signal (i.e., when the input to the clock rises from a low (0) to a high (1) state). The phase/frequency detector 10 provides output pulses $Q_A$ and $Q_B$ which are not complementary, on the Q outputs of the first and second flip-flops 20, 30. The AND gate 40 provides a reset signal to the flip-flops 20, 30 when the output pulses $Q_A$ and $Q_B$ are both high. FIG. 1B is a state diagram of the phase/frequency detector 10 of FIG. 1A. As shown in this state diagram, there are three logical states for the phase/frequency detector 10: State 0 ($Q_A = Q_B = 0$), State I ($Q_A = 1, Q_B = 0$), and State II ($Q_A = 0, Q_B = 1$). The various states are cycled on the leading edges of the A and B signals.

Figure 1C:
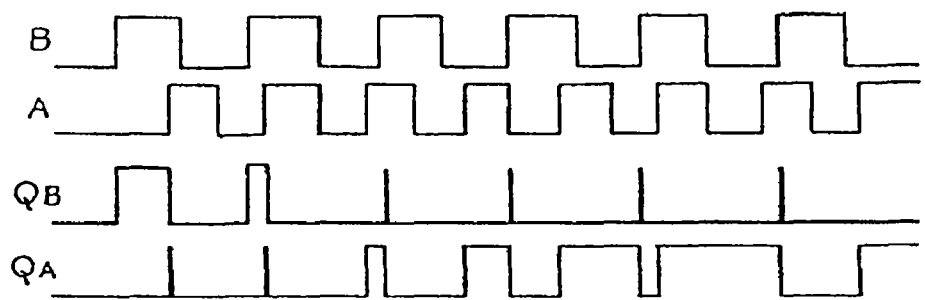
FIG. 1C is a timing diagram of the phase/frequency detector of FIG. 1A when $f_A > f_B$.

One characteristic of the phase/frequency detector 10 is that it can detect both phase and frequency difference between input signals A and B. If the frequency of signal A is greater than the frequency of signal B (i.e., $f_A > f_B$), there will be a time period during which two edges of A happen between two edges of B. This behavior results in the phase/frequency detector 10 eventually toggling between State 0 and State I even when the phase/frequency detector 10 starts from State II. This characteristic is shown in the timing diagram in FIG. 1C. As shown in FIG. 1C, $Q_A$ and $Q_B$ indicate that signal A is "faster" than signal B from a frequency point of view but is lagging from a phase point of view. Initially, the phase/frequency detector 10 gives wrong information, but, later, it gives correct information—that the frequency of signal A is much faster than the frequency of signal B (as indicated by the wide pulses in $Q_A$). Accordingly, the phase/frequency detector 10 not only detects the phase difference between signals A and B but also the frequency difference. In other words, the phase/frequency detector 10 has a "memory" between adjacent time intervals to detect frequency difference between the two signals (i.e., the flip-flops 20, 30 retain and output high values in the time interval between edge comparisons even when the source signals are no longer high).

When the phase/frequency detector 10 is used to compare two signals that have the same frequency, the output of the phase/frequency detector 10 produces a pulse width equal to the phase difference between the signals. However, a problem can occur when there is an aberration in one of the signals. As used herein, an "aberration" in a signal refers to a deviation from the expected shape of the signal. For example, an aberration in a signal can be a high signal during a time in which a low signal is expected or vice versa. An aberration in a signal can come from various source, such as, for example, a noise glitch (i.e., a false or spurious signal caused by a brief unwanted surge of power), coupling between clock or pulse signals and the phase/frequency detector 10, or ground bouncing.

Figure 1D:
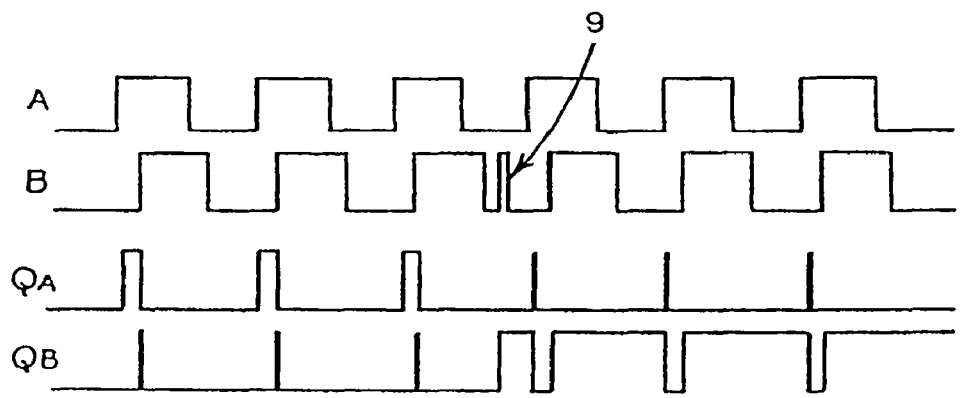
FIG. 1D is a timing diagram of the phase/frequency detector of FIG. 1A when $f_A = f_B$ and an aberration causes an erroneous high signal in one of the input signals.
Figure 1E:
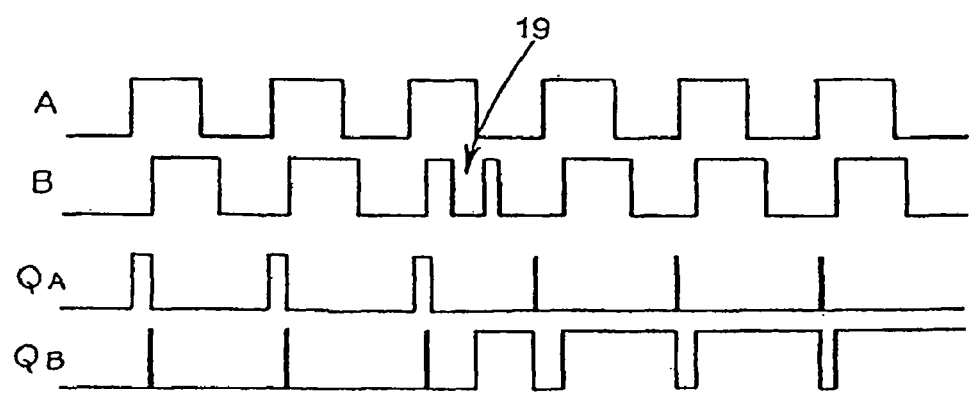
FIG. 1E is a timing diagram of the phase/frequency detector of FIG. 1A when $f_A = f_B$ and an aberration causes an erroneous low signal in one of the input signals.

An aberration in one of the signals can generate an error in phase comparison (i.e., an indication that the signal has a leading phase relationship instead of a lagging phase relationship, or vice versa) because of the memory capability of the phase/frequency detector 10. This phenomenon is illustrated in the timing diagram of FIG. 1D. There, an aberration 9 occurs in signal B, causing a high signal during a time in which a low signal is expected. Prior to the aberration 9, $Q_A$ has wider pulses than $Q_B$, correctly indicating that the leading edges of the pulses in signal A occur before the leading edges of the pulses in signal B (i.e., signal A is leading signal B). After the aberration 9, $Q_B$ contains wider pulses than $Q_A$, providing the false indication that signal B is leading signal A. That is, when the aberration 9 happens in signal B, $Q_B$ will generate wrong pulses to indicate that signal B is ahead of signal A, even though signal B is still behind signal A. The timing diagram of FIG. 1E shows a similar error occurring when the aberration 19 causes a low signal during a time in which a high signal is expected. Accordingly, the "memory" capability of the phase/frequency detector 10, while providing the advantage of indicating a frequency difference between two signals, leads to an error in phase detection when the signals are of the same frequency and one of the signals contains an aberration.

To avoid this problem, in one embodiment, the "memory" capability is removed from the phase/frequency detector, essentially transforming it into a phase (but not frequency) detector. This allows the phase detector to provide a correct indication of phase difference even when an aberration is present in one of the signals. FIG. 2 is a functional block diagram of a phase detector 100 of an embodiment that has the "memory" capability removed. Like the phase/frequency detector 10 in FIG. 1A, the phase detector 100 of this embodiment comprises first and second D flip-flops ($DFF_A$ 120 and $DFF_B$ 130), each having a D input, a clock input, a reset input, and a Q output. The D inputs of the first and second flip-flops 120, 130 are provided with a 1 (or high) signal, and the two signals to be compared (signals A and B) are provided to the clock inputs of the first and second flip-flops 120, 130 from first and second inputs 125, 135. The phase detector 100 also comprises a first AND gate 140, whose inputs are in communication with the Q outputs of the first and second flip-flops 120, 130. The output of the first AND gate 140 is provided to the reset inputs of the first and second flip-flops 120, 130. As described above, the first and second flip-flops 120, 130 and the first AND gate 140 are operative to provide an indication of a phase difference between a first signal supplied by the first input 125 and a second signal supplied by the second input 135. While this function is performed by the first and second flip-flops 120, 130 and the first AND gate 140 in this embodiment, it should be noted that other circuitry can be used to perform this function.

As used herein, "circuitry" broadly refers to any suitable electrical component that can be used to perform the function attributed to the circuitry. "Circuitry" can also refer to a processor executing computer-readable software instructions (accordingly, the functionality described herein can be stored as instructions in a computer-readable medium). Specific components used herein to illustrate the embodiments should not be read into the term "circuitry" in the following claims unless explicitly recited therein. Also as used herein, the phrase "in communication with" means directly in communication with or indirectly in communication with through one or more components named or unnamed in this document. Two components that are in communication with each other do not necessarily have to be directly or indirectly physically connected.

If only the circuitry described above (i.e., an example of "first circuitry") is used, an aberration in one of the first and second signals can result in an incorrect indication of phase difference due to the "memory" capability of the circuitry. In this embodiment, the phase detector 100 comprises additional circuitry that is operative to provide a correct indication of phase difference despite such an aberration. In other words, this additional circuitry disables the "memory" (i.e., frequency-detecting) capability of the detector. Specifically, the additional circuitry (i.e., an example of "second circuitry") comprises first and second OR gates 150, 160 and first, second, and third AND gate 170, 180, 190. The two signals to be compared (signals A and B) are provided as inputs to the second AND gate 170 and the second OR gate 160. This has the effect of resetting the first and second flip-flops 120, 130 when the two signals are both in a first state (e.g., both high) and to prevent the outputs of the first and second flip-flops 120, 130 from reaching the first and second outputs 195, 198 of the phase detector 100 when the two signals are both in a second state (e.g., both low). Accordingly, this additional circuitry disables the ability of the circuitry described in the preceding paragraph (i.e., the first and second flip-flops 120, 130 and the first AND gate 140) to provide an indication of frequency difference by resetting the phase detector within the time interval before the next edge comparison.

More specifically, the second AND gate 170 resets the flip-flops 120, 130 when both signals A and B are in a first state (here, when they are both high). The first OR gate 150 allows with first and second flip-flops to be reset when either (1) both signals A and B are high ("Reset 1") or (2) both outputs of the first and second flip-flops 120, 130 are high ("Reset 2"). To avoid a possible error being introduced to the phase comparison, it is preferred that a delay be introduced (e.g., through a series of inverters) to ensure that Reset 1 occurs after the reset pulse (the "dead zone") caused by Reset 2.

The second OR gate 160 and the second and third AND gates 180, 190 operate such that when signals A and B are both in a second state (here, low), $Q_A$ and $Q_B$ are both gated (i.e., the outputs of the first and second flip-flops 120, 130 are prevented from reaching the first and second outputs 195, 198 of the phase detector 100. Accordingly, by adding this feature and the feature described in the preceding paragraph, the phase detector 100 of this embodiment will not provide the ongoing phase error that the phase/frequency detector 10 in FIG. 1A provides when an aberration is present in one of the signals being compared. No matter when the aberration occurs in the signal, the phase detector 100 will be ready before next edge comparison without any "memory" problems.

The timing diagrams in FIGS. 3 and 4 show how the additional circuitry is operative to provide a correct indication of phase difference despite the aberration in one of the signals being compared. In FIG. 3, the aberration 29 is a high signal during a time in which a low signal is expected, whereas in FIG. 4, the aberration 39 is a low signal during a time in which a high signal is expected. As shown in these figures, even though the $Q_B$ signals contain an extra pulse where the aberration occurred, the phase detector 100 is ready to detect the next edge difference before the next edge comparison happens, thereby providing a correct indication of phase difference despite the aberration in one the signals. That is, once the phase detector 100 compares the phase edge, it resets itself and is ready for the next edge to be compared. Accordingly, while an error occurred in the $Q_B$ signals (i.e., the extra pulse where the aberration occurred indicates that the phase of signal B is ahead of the phase of signal A), the additional circuitry in this embodiment minimizes the error introduced into the final result. In this way, the phrase "provide a correct indication of phase difference," as used herein, does not necessarily mean that a correct indication of phase difference is provided in the period of the aberration.

In the embodiment discussed above, phase difference was indicated based on the leading edges of the first and second signals. In an alternate embodiment, phase difference is indicated based on the trailing edges of the first and second signals. In this alternate embodiment, instead of signals A and B, inverted signals A and B are provided to the flip-flops 120, 130, second AND gate 170, and second OR gate 160. In yet another alternative, a phase detector can be designed to provide an indication of the phase difference between the two signals based on both leading and trailing edges. In this alternative, two phase detectors would be used: a phase detector operating on leading edges and a phase detector operating on trailing edges. The outputs of the two phase detectors would be summed together.

The phase detector 100 in this embodiment can be used in any suitable application. For example, the phase detector 100 can be used in a phase-locked loop. The phase detector 100 can also be used in optical storage applications, such as in a differential phase detection circuit within an optical disc drive for reading optical discs such as DVD ROMS and other ROM media types (e.g., HD-DVD, Bluray, and those using other present or future standards). By way of background, in an optical pickup unit (e.g., in an optical disc drive), there is generally an array of at least four photodetectors, the main elements of which are referred to herein as the A, B, C, D photodetectors. When reading an optical disc, a spot of light is emitted onto the optical disc, and, under the influence of the pits and lands recorded on the disc, a diffraction pattern is imaged onto the A, B, C, D photodetectors. The image is converted into electrical signals that are provided to a differential phase detector, as well as to other circuits. The electrical signals are identical to each other except that, if the scanning spot is not on the track center line, they will be phase shifted with respect to each other. Accordingly, the amount that the A, B, C, D photodetector signals are phase shifted with respect to each other is proportional to the distance that the scanning spot is off the track center line. The output of the differential phase detector is indicative of the radial error and is digitized and provided to servo firmware to reposition the optics along the track center line.

Figure 5:
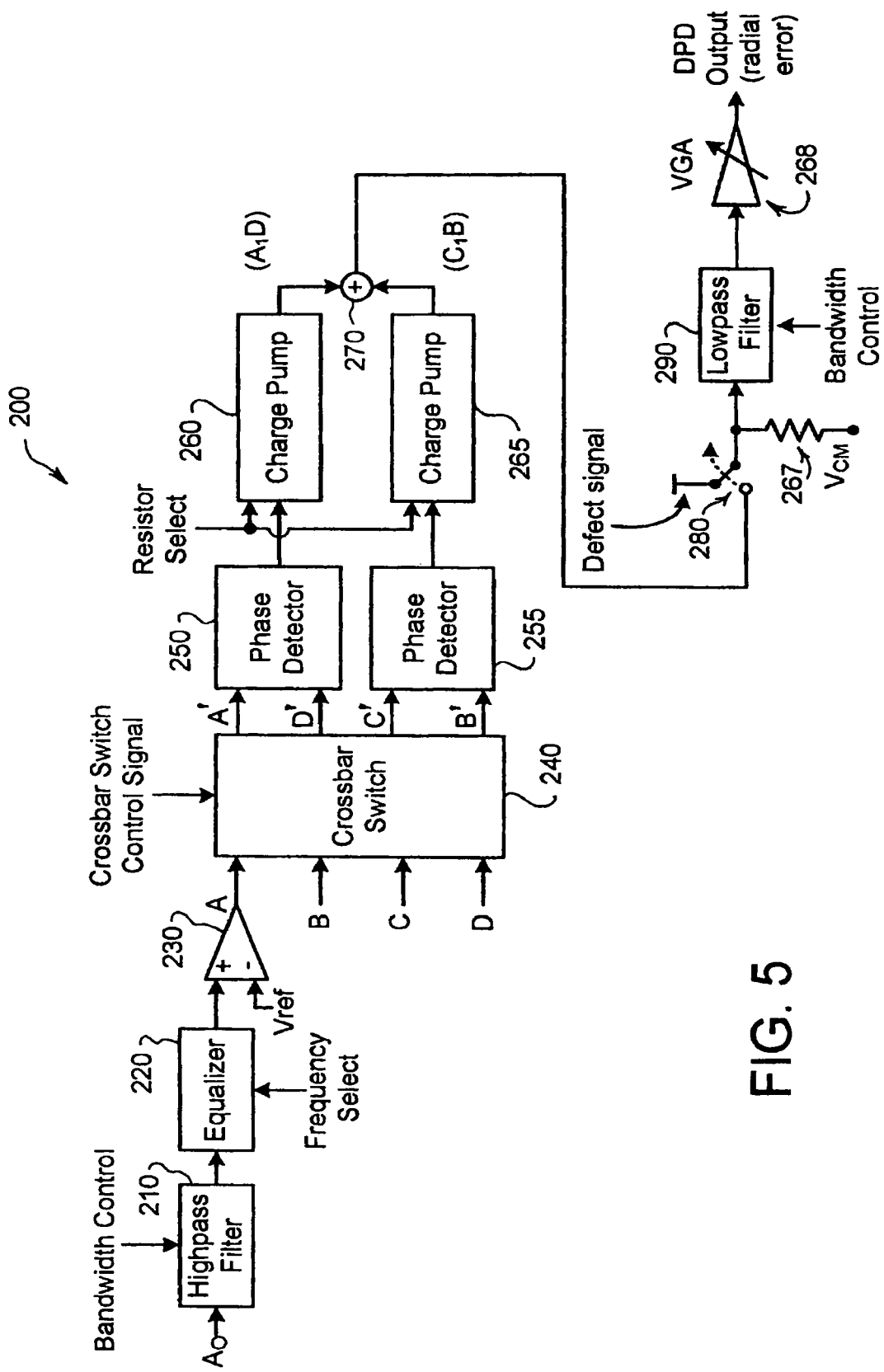
FIG. 5 is a functional block diagram of a differential phase detector of an embodiment.

Turning again to the drawings, FIG. 5 is a functional block diagram of a differential phase detector 200 of an embodiment. As shown in FIG. 5, the differential phase detector 200 comprises a highpass filter 210, an equalizer 220, a comparator 230, a crossbar switch 240, first and second phase detectors 250, 255, first and second charge pumps 260, 265, a summer 270, a switch 280, a resistor 267 tied to a common mode voltage $V_{cm}$, a lowpass filter 290, and a gain-up stage amplifier VGA 268. (To simplify the drawing, FIG. 5 only shows a highpass filter 210, an equalizer 220, and a comparator 230 for the A signal. Similar components would be provided for the B, C, and D signals.) In operation, the highpass filter 210 removes the DC content from the signal, as well as any low frequency perturbations caused by fingerprints or other effects. The highpass filter 210 has a bandwidth control input for changing the location of the lower edge of the pass band. The equalizer 220 provides a high frequency boost and, thereby, reduces the jitter of the photodetector signal prior to "slicing." The equalizer 220 has a frequency select input for selecting the frequency boost. The comparator 230 "slices" the signal to provide a square wave.

The sliced A, B, C, D outputs of the comparators are then provided to the crossbar switch 240. In this differential phase detector 200, in order to provide a more robust radial error signal, phase detection is performed on two pairs of photodetector signals (here, A and D, and B and C), and the outputs of the phase detectors 250, 255 are averaged. The crossbar switch 240 provides the ability to remap the sliced photodiode signals, if necessary, to determine which photodetector signals are phase compared (e.g., A and C instead of A and D). This capability is useful for two reasons. First, since different optical pickup unit vendors tend to use dissimilar pinouts and naming conventions, the crossbar switch 240 allows flexibility in laying out the printed circuit board. Accordingly, the crossbar switch 240 allows flexibility in re-routing signals in the way that is useful to the differential phase detector 200 irrespective of the conventions used by the manufacturer of the optical pickup unit. Second, the crossbar switch 240 can be used to select either the DTD4 (Differential Time Detection, Type 4) or the DTD4a (Differential Time Detection, Type 4a) method of generating the radial position error signal.

Figure 6:
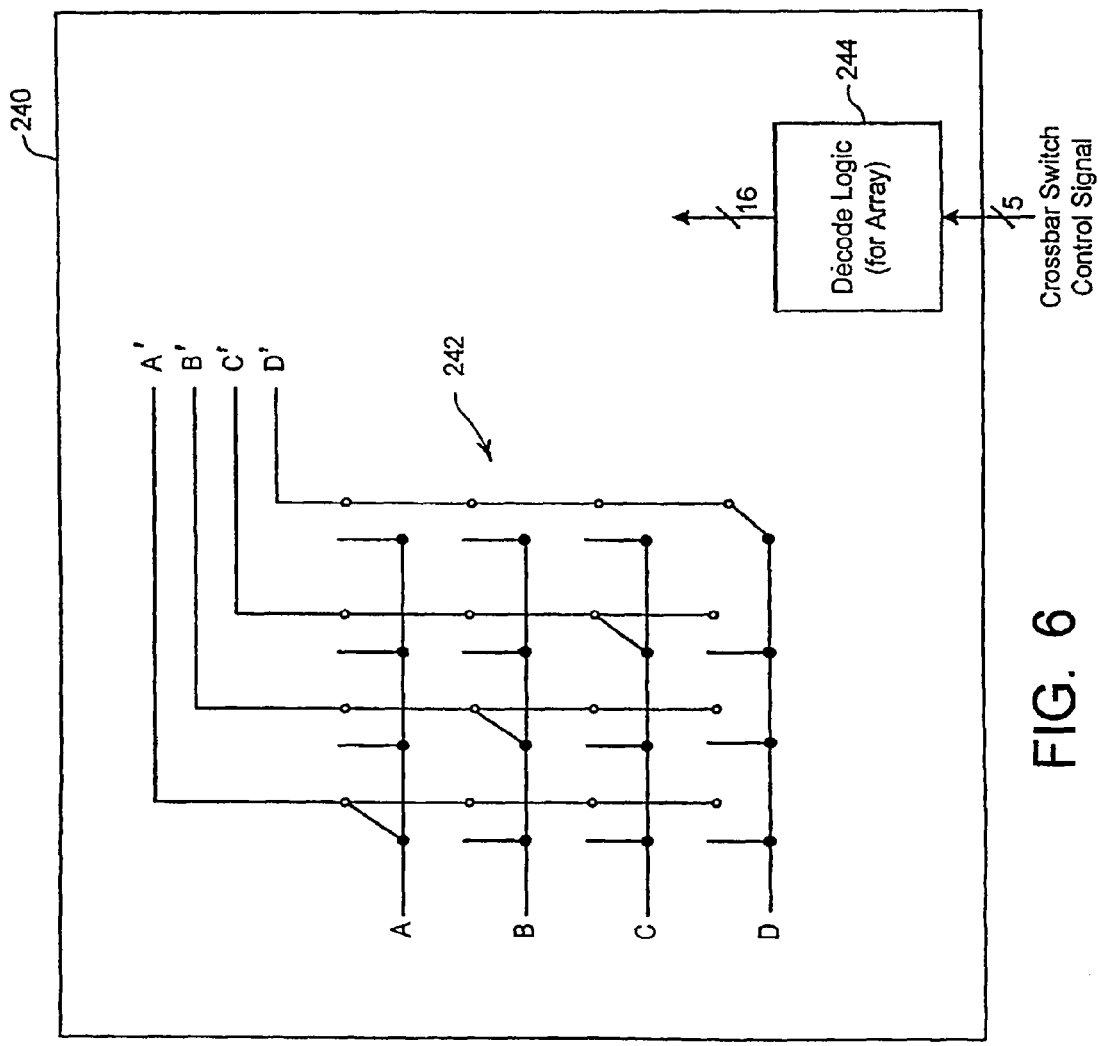
FIG. 6 is a functional block diagram of a crossbar switch of the differential phase detector of an embodiment.

FIG. 6 is a functional block diagram of the crossbar switch 240. As shown in FIG. 6, the crossbar switch 240 comprises an array of switches 242 and decode logic 244 for the array 242. There are 24 ways (4!) in which the four inputs to the crossbar switch 240 can be connected to its four outputs. Based on the crossbar switch control signal, the decode logic 244 selects one of 24 valid switch configurations. The decode logic 244 maps a five-bit register value into the control signals that determine which of the 16 switches in the crossbar switch array 242 are closed. In this embodiment, bits 4:3 of the register select which of the outputs the A input is connected to. Bits 2:1 select which of the remaining outputs receives the B input. Bit 0 selects which remaining output receives the C input. The D input is routed to whichever output is left. In one implementation, the normal setup for this register field results in no re-mapping of the sliced phase detector input signals.

The paired outputs of the crossbar switch 240 are provided to the first and second phase detectors 250, 255. In this embodiment, the first and second phase detectors 250, 255 take the form of the phase detector 100 described above, and, more preferably use the alternative that phase detection is triggered on both the leading and trailing edges of the signal. Such a phase detector is preferred because there are often missing pulses in the electrical signals from the A, B, C, D photodetectors. Accordingly, if a conventional phase/frequency detector, such as the one shown in FIG. 1A were used, the differential phase detector would generate an incorrect phase difference. If the phase measurement is corrupted, at least over the short term, the differential phase detector would introduce an incorrect radial error signal into the servo loop that controls the radial position of the optics. Eventually, the situation may correct itself, but the corrupted phase measurement would degrade the tracking error performance (i.e., the RMS tracking error).

Figure 7:
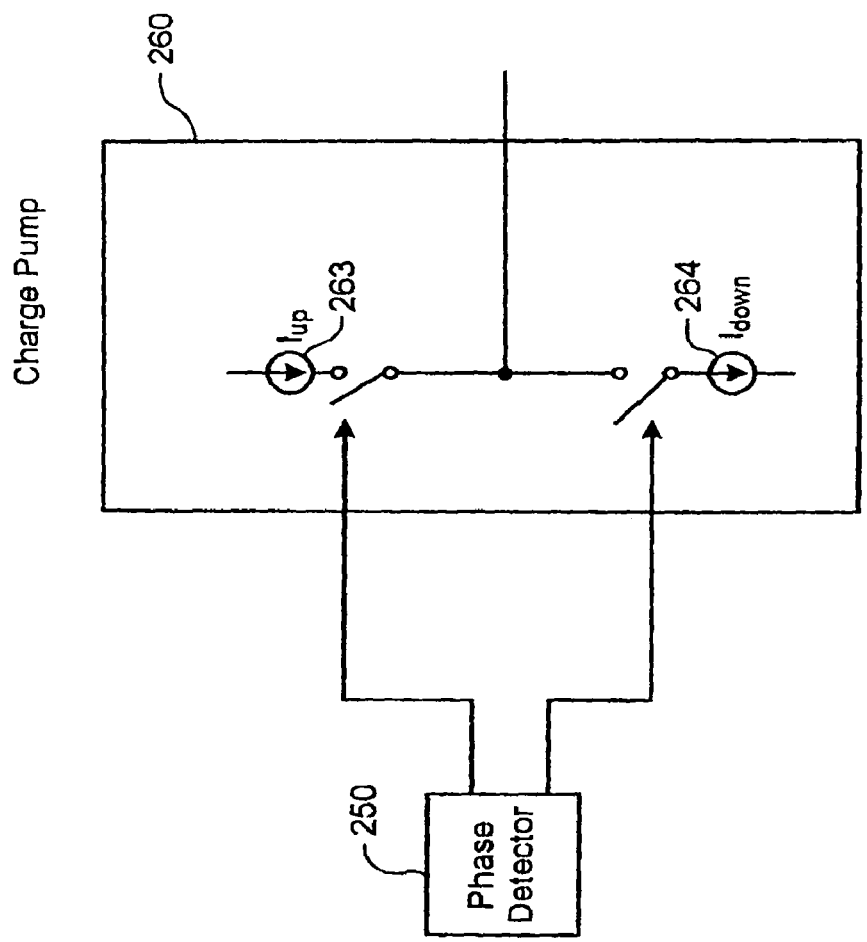
FIG. 7 is a functional block diagram of a charge pump of a differential phase detector of an embodiment.

The outputs of the first and second phase detectors 250, 255 are then provided to the first and second charge pumps 260, 265, respectively. FIG. 7 is a functional block diagram of one of the charge pumps 260. As shown in FIG. 7, the charge pump 260 comprises a "current up" current source $I_{up}$ 263 and a "current down" current source $I_{down}$ 264. The two current sources 263, 264 are connected to the $Q_A$ and $Q_B$ outputs of the phase detector 250. When the $Q_A$ and $Q_B$ outputs are high, the corresponding switches close, providing or drawing current from the resistor 267 that is tied to the common mode voltage $V_{cm}$. The voltage is then provided to the lowpass filter 290, followed by the gain-up stage amplifier VGA 268.

Referring back to FIG. 5, the outputs of the first and second charge pumps 260, 265, are then summed by the summer 270. The switch 280 is used to prevent the output of the summer 270 from reaching the lowpass filter 290 if there is a detected defect in the optical storage media, as indicated by the defect signal. A defect in the optical storage media can be, for example, a fingerprint, scratch, or some imperfection on the surface of the disc that somehow scatters, defocuses, or redirects the reflected light. If such a defect is detected, the switch 280 is thrown to a common mode voltage $V_{CM}$, which is essentially zero. This prevents an unreliable radial error signal from being provided to downstream components. If a defect is not detected, the output of the summer 270 is provided to the lowpass filter 290, which attenuates high frequency noise to smooth the signal before providing it to the gain-up stage amplifier VGA 268.

Figure 8:
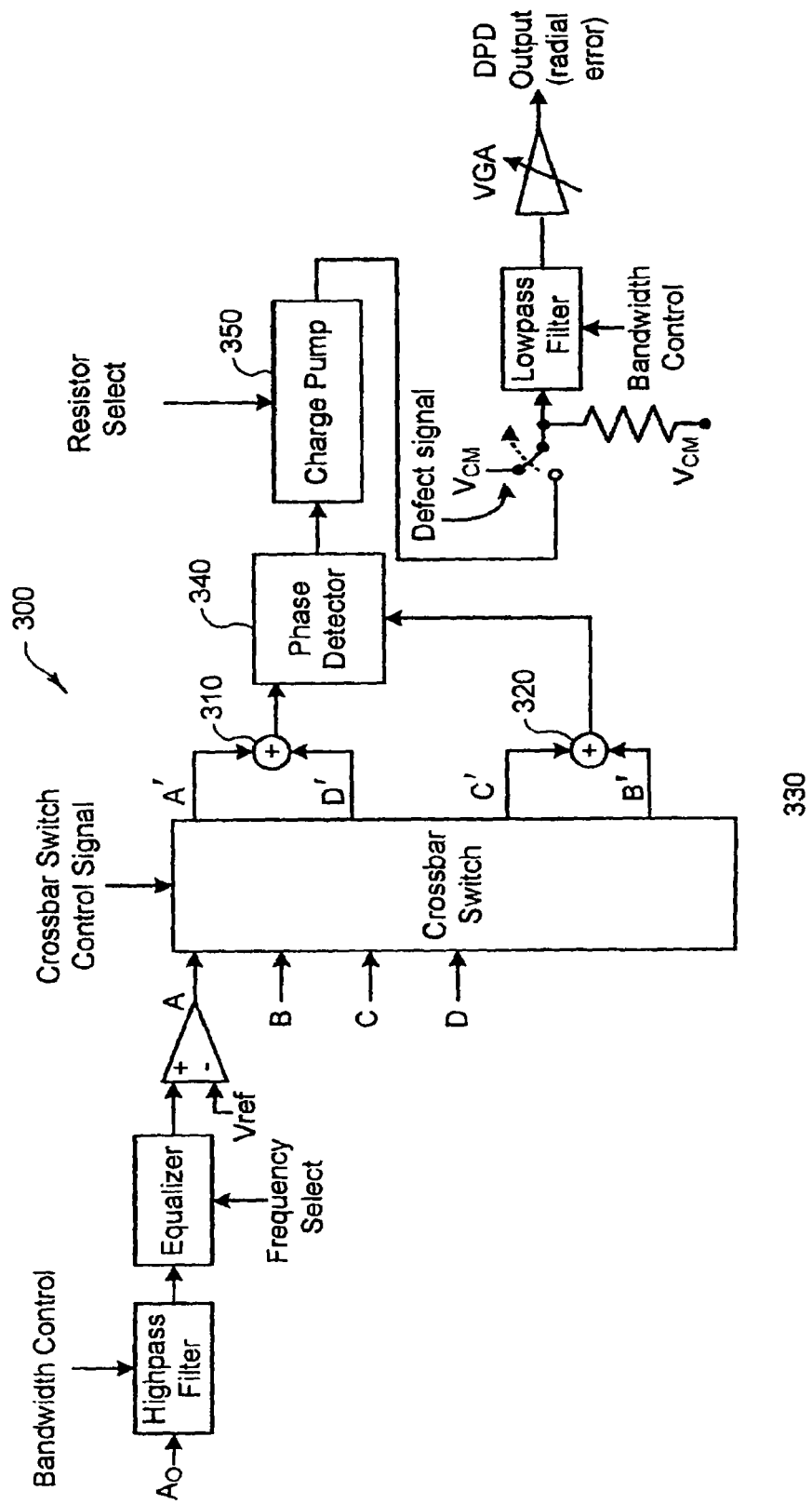
FIG. 8 is a functional block diagram of a differential phase detector of another embodiment.

It should be noted that alternatives to the differential phase detector shown in FIG. 5 can be used. For example, while the first and second phase detectors in this embodiment have their "memory" capability removed to avoid incorrect phase indications caused by aberrations in the input signals, a conventional or other type of phase/frequency detector can be used. Accordingly, the following claims should not be interpreted as requiring a specific type of phase detector unless explicitly recited therein. Additionally, as shown in the alternate differential phase detector 300 in FIG. 8, the summing stage can be repositioned. In the alternate embodiment in FIG. 8, two summers 310, 320 are located between the crossbar switch 330 and phase detector 340 instead of after the charge pump 350.

Figure 9A:
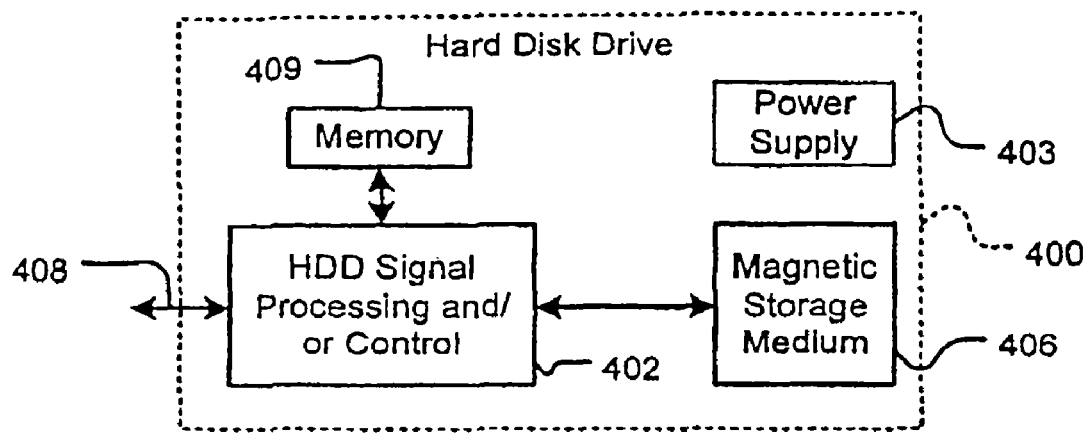
FIG. 9A is a functional block diagram of a hard disk drive of an embodiment.

Referring now to FIGS. 9A-9G, various exemplary implementations of the present invention are shown. Referring now to FIG. 9A, the present invention can be implemented in a hard disk drive 400. The present invention may implement and/or be implemented in either or both signal processing and/or control circuits and/or a power supply 403, which are generally identified in FIG. 9A at 402. In some implementations, the signal processing and/or control circuit 402 and/or other circuits (not shown) in the HDD 400 may process data, perform coding and/or encryption, perform calculations, and/or format data that is output to and/or received from a magnetic storage medium 406.

The HDD 400 may communicate with a host device (not shown) such as a computer, mobile computing devices such as personal digital assistants, cellular phones, media or MP3 players and the like, and/or other devices via one or more wired or wireless communication links 408. The HDD 400 may be connected to memory 409 such as random access memory (RAM), low latency nonvolatile memory such as flash memory, read only memory (ROM) and/or other suitable electronic data storage.

Figure 9B:
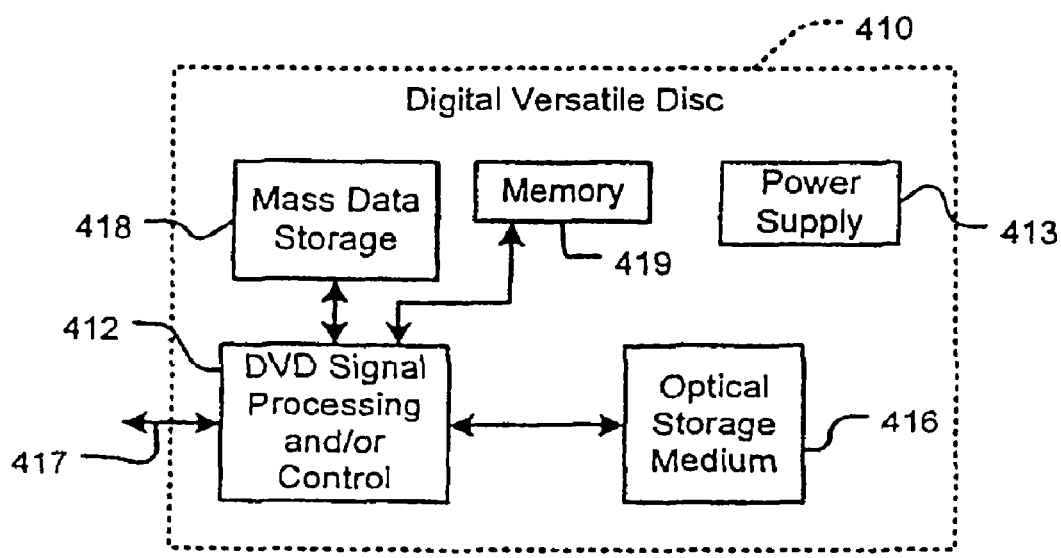
FIG. 9B is a functional block diagram of a digital versatile disk (DVD) of an embodiment.

Referring now to FIG. 9B, the present invention can be implemented in a digital versatile disc (DVD) drive 410. The present invention may implement and/or be implemented in either or both signal processing and/or control circuits, which are generally identified in FIG. 9B at 412, mass data storage of the DVD drive 410 and/or a power supply 413. The signal processing and/or control circuit 412 and/or other circuits (not shown) in the DVD 410 may process data, perform coding and/or encryption, perform calculations, and/or format data that is read from and/or data written to an optical storage medium 416. In some implementations, the signal processing and/or control circuit 412 and/or other circuits (not shown) in the DVD 410 can also perform other functions such as encoding and/or decoding and/or any other signal processing functions associated with a DVD drive.

The DVD drive 410 may communicate with an output device (not shown) such as a computer, television or other device via one or more wired or wireless communication links 417. The DVD 410 may communicate with mass data storage 418 that stores data in a nonvolatile manner. The mass data storage 418 may include a hard disk drive (HDD). The HDD may have the configuration shown in FIG. 9A. The HDD may be a mini HDD that includes one or more platters having a diameter that is smaller than approximately 1.8". The DVD 410 may be connected to memory 419 such as RAM, ROM, low latency nonvolatile memory such as flash memory and/or other suitable electronic data storage.

Figure 9C:
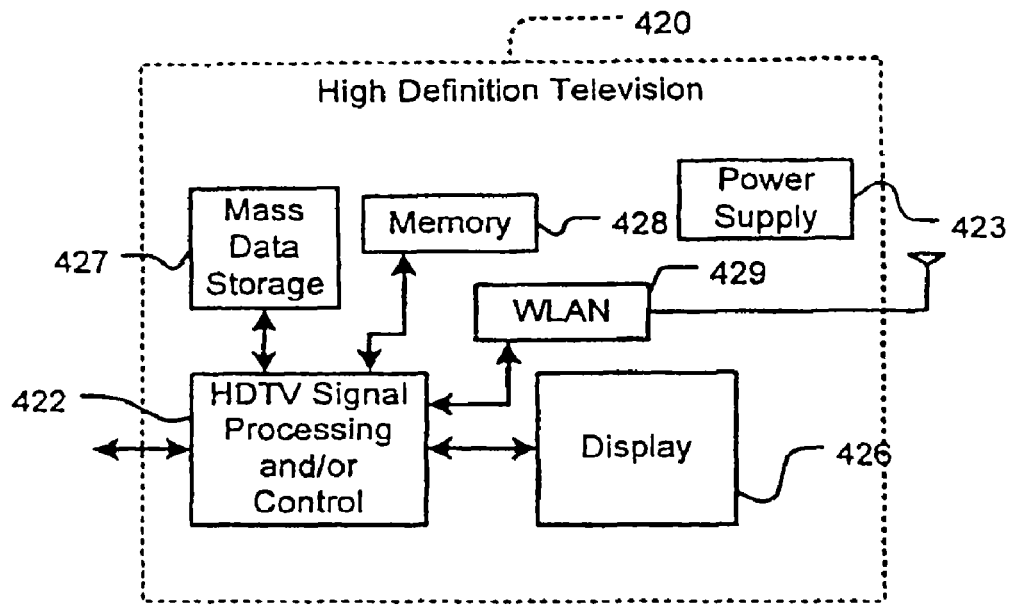
FIG. 9C is a functional block diagram of a high definition television of an embodiment.

Referring now to FIG. 9C, the present invention can be implemented in a high definition television (HDTV) 420. The present invention may implement and/or be implemented in either or both signal processing and/or control circuits, which are generally identified in FIG. 9C at 422, a WLAN interface, mass data storage of the HDTV 420 and/or a power supply 423. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. At least one HDD may have the configuration shown in FIG. 9A and/or at least one DVD may have the configuration shown in FIG. 9B. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Figure 9D:
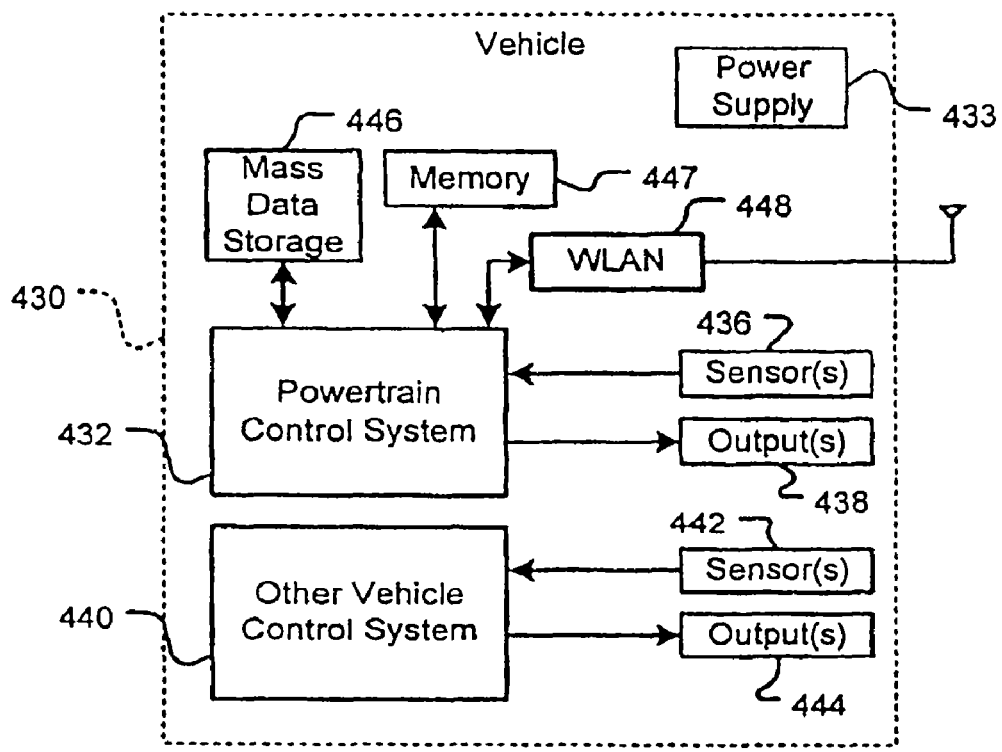
FIG. 9D is a functional block diagram of a vehicle control system of an embodiment.

Referring now to FIG. 9D, the present invention may implement and/or be implemented in a control system of a vehicle 430, a WLAN interface, mass data storage of the vehicle control system and/or a power supply 433. In some implementations, the present invention implement a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. At least one HDD may have the configuration shown in FIG. 9A and/or at least one DVD may have the configuration shown in FIG. 9B. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Figure 9E:
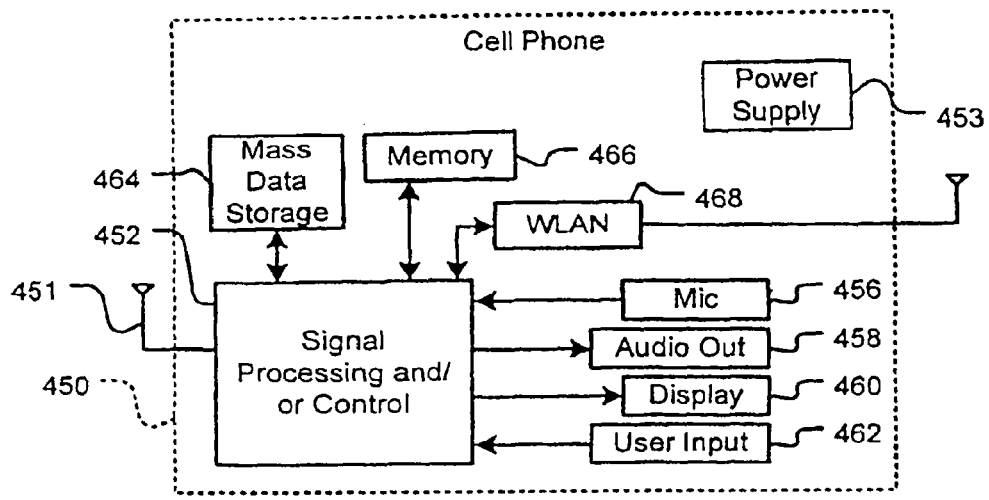
FIG. 9E is a functional block diagram of a cellular phone of an embodiment.

Referring now to FIG. 9E, the present invention can be implemented in a cellular phone 450 that may include a cellular antenna 451. The present invention may implement and/or be implemented in either or both signal processing and/or control circuits, which are generally identified in FIG. 9E at 452, a WLAN interface, mass data storage of the cellular phone 450 and/or a power supply 453. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. At least one HDD may have the configuration shown in FIG. 9A and/or at least one DVD may have the configuration shown in FIG. 9B. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 9F:
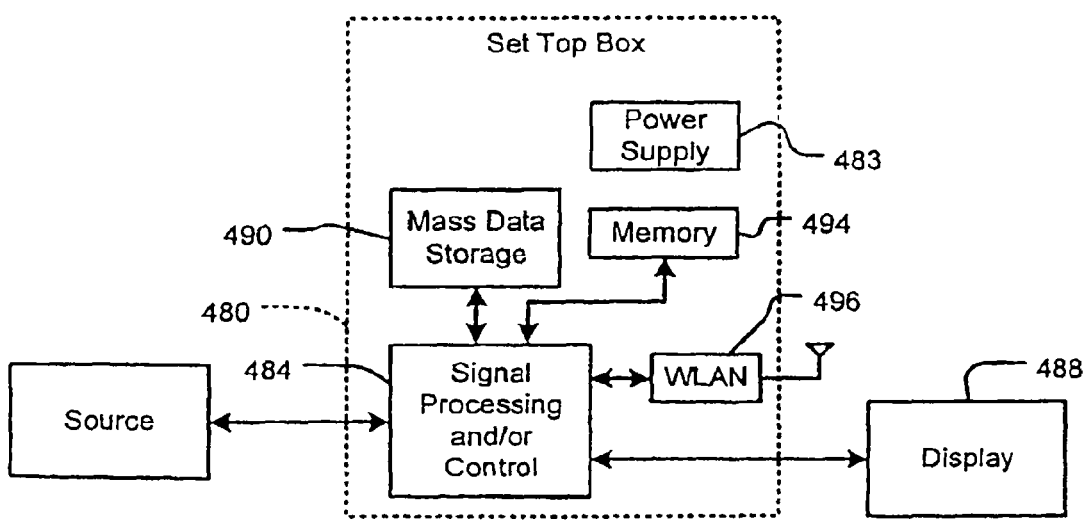
FIG. 9F is a functional block diagram of a set top box of an embodiment.

Referring now to FIG. 9F, the present invention can be implemented in a set top box 480. The present invention may implement and/or be implemented in either or both signal processing and/or control circuits, which are generally identified in FIG. 9F at 484, a WLAN interface, mass data storage of the set top box 480 and/or a power supply 483. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. At least one HDD may have the configuration shown in FIG. 9A and/or at least one DVD may have the configuration shown in FIG. 9B. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496.

Figure 9G:
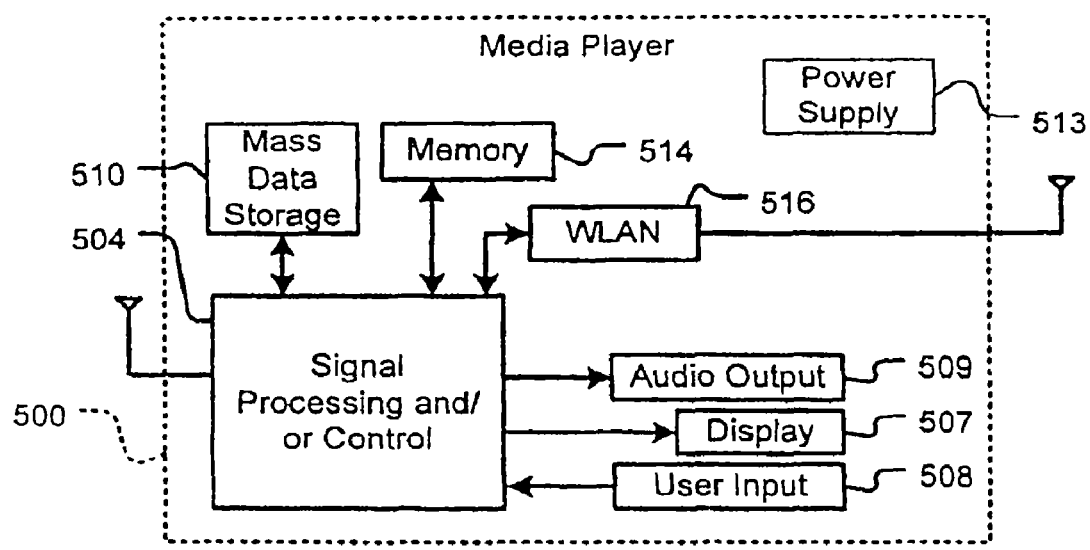
FIG. 9G is a functional block diagram of a media player of an embodiment.

Referring now to FIG. 9G, the present invention can be implemented in a media player 500. The present invention may implement and/or be implemented in either or both signal processing and/or control circuits, which are generally identified in FIG. 9G at 504, a WLAN interface, mass data storage of the media player 500 and/or a power supply 513. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 9A and/or at least one DVD may have the configuration shown in FIG. 9B. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

It is intended that the foregoing detailed description be understood as an illustration of selected forms that the invention can take and not as a definition of the invention. It is only the following claims, including all equivalents, that are intended to define the scope of this invention.

What is claimed:

1. A phase detector comprising:
   a first input configured to receive a first signal;
   a second input configured to receive a second signal; first circuitry in communication with the first and second inputs,
   the first circuitry operative to provide an indication of a phase difference between the first signal and the second signal; and second circuitry in communication with the first circuitry, the second circuitry operative to reduce an effect of an aberration in at least one of the first and second signals, wherein the first circuitry outputs a first reset signal and the second circuitry outputs a second reset signal such that the first reset signal and the second reset signal are operative to reset at least a part of the first circuitry, the first reset signal and the second reset signal being independent from one another.

2. The phase detector of claim 1, wherein the first circuitry is operative to provide an indication of frequency difference between the first and second signals, and wherein the second circuitry disables the first circuitry's ability to provide the indication of the frequency difference.

3. The phase detector of claim 1, wherein the first circuitry is operative to provide the indication of the phase difference between the first and second signals based on leading edges of the first and second signals.

4. The phase detector of claim 1, wherein the first circuitry is operative to provide the indication of the phase difference between the first and second signals based on leading and trailing edges of the first and second signals.

5. The phase detector of claim 1, wherein the phase detector comprises first and second outputs, and wherein the second circuitry is operative to prevent signals on the respective outputs of first and second flip-flops of the first circuitry from reaching the first and second outputs, respectively, of the phase detector when the first signal and the second signal are in a common state.

6. The phase detector of claim 1, wherein the first reset signal resets the first circuitry at a first time and the second reset signal resets the first circuitry at a second time.

7. A method for comparing phases of first and second signals, the method comprising:
receiving first and second signals, each signal comprising a respective phase;
generating, by first circuitry, an indication of a phase difference based on the first and second signals;
reducing, by second circuitry, an effect of an aberration in at least one of the first and second signals in order to provide a correct indication of the phase difference between the first and second signals;
outputting, by the first circuitry, a first reset signal; and
outputting, by the second circuitry, a second reset signal,
wherein the first reset signal and the second reset signal are operative to reset at least a part of the first circuitry, the first reset signal and the second reset signal being independent from one another.

8. The method of claim 7, further comprising providing the correct indication of the phase difference between the first and second signals based on leading edges of the first and second signals.

9. The method of claim 8, further comprising providing the correct indication of the phase difference between the first and second signals based on trailing edges of the first and second signals.

10. The method of claim 7, wherein reducing the effect of the aberration in order to provide the correct indication of the phase difference further comprises gating the output of the phase detector in response to the first and second signals both being low.

11. The method of claim 7, wherein the first reset signal resets the first circuitry at a first time and the second reset signal resets the first circuitry at a second time.

12. A differential phase detector comprising:
a phase detector comprising:
first circuitry in communication with first and second inputs, the first circuitry operative to provide an indication of a phase difference between a first signal received by the first input and a second signal received by the second input; and
second circuitry in communication with the first circuitry, the second circuitry operative to reduce an effect of an aberration and to provide a correct indication of the phase difference; and
a charge pump in communication with an output of the phase detector,
wherein the first circuitry outputs a first reset signal and the second circuitry outputs a second reset signal such that the first reset signal and the second reset signal are operative to reset at least a part of the first circuitry, the first reset signal and the second reset signal being independent from one another, and
wherein the differential phase detector provides an output indicative of a radial error.

13. The differential phase detector of claim 12, wherein the phase detector comprises a phase/frequency detector.

14. The differential phase detector of claim 12, wherein the phase detector is operative to provide the indication of the phase difference between the first and second signals based on leading edges of the first and second signals.

15. The differential phase detector of claim 14, wherein the phase detector is further operative to provide the indication of the phase difference between the first and second signals based on trailing edges of the first and second signals.

16. The differential phase detector of claim 12, wherein the phase detector comprises first and second outputs, and wherein the second circuitry is operative to prevent signals on respective outputs of first and second flip-flops of the first circuitry from reaching the first and second outputs, respectively, of the phase detector when the first and second signals are in a common state.

17. The differential phase detector of claim 12, further comprising:
a plurality of inputs; and
an array of switches in communication with the plurality of inputs;
wherein the array of switches is operative to connect selected ones of the plurality of inputs to the phase detector.

18. The differential phase detector of claim 12, further comprising:
a plurality of inputs;
a phase detector in communication with the plurality of inputs; and
means for connecting selected ones of the plurality of inputs to the phase detector.

19. The differential phase detector of claim 18, wherein the means for providing connecting comprises an array of switches.

20. The differential phase detector of claim 12, wherein the first reset signal resets the first circuitry at a first time and the second reset signal resets the first circuitry at a second time.

* * * * *